(12) United States Patent  (10) Patent No.: US 7,845,677 B2
Franke  (45) Date of Patent: Dec. 7, 2010

(54) TRIGGERING DEVICE FOR A SAFETY DEVICE IN AN AUTOMOTIVE VEHICLE

(75) Inventor: Jörg Franke, Freiburg (DE)

(73) Assignee: Micronas GmbH, Freiburg i.Br. (DE)

( * ) Notice: Subject to any disclaimer, the term of this patent is extended or adjusted under 35 U.S.C. 154(b) by 177 days.

(21) Appl. No.: 12/182,658

(22) Filed: Jul. 30, 2008

(65) Prior Publication Data

US 2009/0066066 A1    Mar. 12, 2009

(30) Foreign Application Priority Data

Jul. 31, 2007    (EP) .................. 07014972

(51) Int. Cl.
 *B60R 21/16*    (2006.01)
(52) U.S. Cl. ...................... 280/735
(58) Field of Classification Search .......... 280/735
 See application file for complete search history.

(56) References Cited

U.S. PATENT DOCUMENTS

| 5,419,407 | A | 5/1995 | Meyer et al. |
| 5,435,409 | A | 7/1995 | Meyer et al. |
| 6,536,259 | B2 * | 3/2003 | Mattes ............ 73/12.09 |
| 7,231,803 | B2 | 6/2007 | Stuetzler |
| 2005/0274168 | A1 | 12/2005 | Stuetzler |
| 2006/0241834 | A1 | 10/2006 | Kithil |

FOREIGN PATENT DOCUMENTS

| DE | 2212190 A1 | 9/1973 |
| DE | 3716168 A1 | 11/1988 |
| DE | 4237404 A1 | 5/1994 |
| DE | 4309827 A1 | 9/1994 |
| DE | 4325414 A1 | 2/1995 |
| DE | 102004036501 A1 | 3/2006 |
| DE | 102005014013 A1 | 9/2006 |
| EP | 0519381 A1 | 12/1992 |
| EP | 0978425 A1 | 2/2000 |
| EP | 1604870 A2 | 12/2005 |

OTHER PUBLICATIONS

"Integrated Forcesensor in Standard CMOS Technology", Fraunhofer Institute for Integrated Circuits IIS, Erlangen Germany. (Abstract only) website:http://www.iis.fraunhofer.de/Images/kraft_e_tcm97-72707.pdf.

* cited by examiner

*Primary Examiner*—Faye M. Fleming
(74) *Attorney, Agent, or Firm*—Muncy, Geissler, Olds & Lowe, PLLC

(57) ABSTRACT

A triggering device for a safety device in an automotive vehicle, in particular for an airbag, has an electrical component that has at least one force sensor and that is attached to the body of the automotive vehicle in such a way that a measurement signal that is dependent on the deformation of the body can be applied at a measurement signal output of the force sensor. An evaluation device for processing the measurement signal is connected to the measurement signal output. The force sensor has at least one piezo element, which is integrated into a CMOS chip together with the evaluation device.

16 Claims, 8 Drawing Sheets

TRIGGERING DEVICE FOR A SAFETY DEVICE IN AN AUTOMOTIVE VEHICLE

Figure 1:
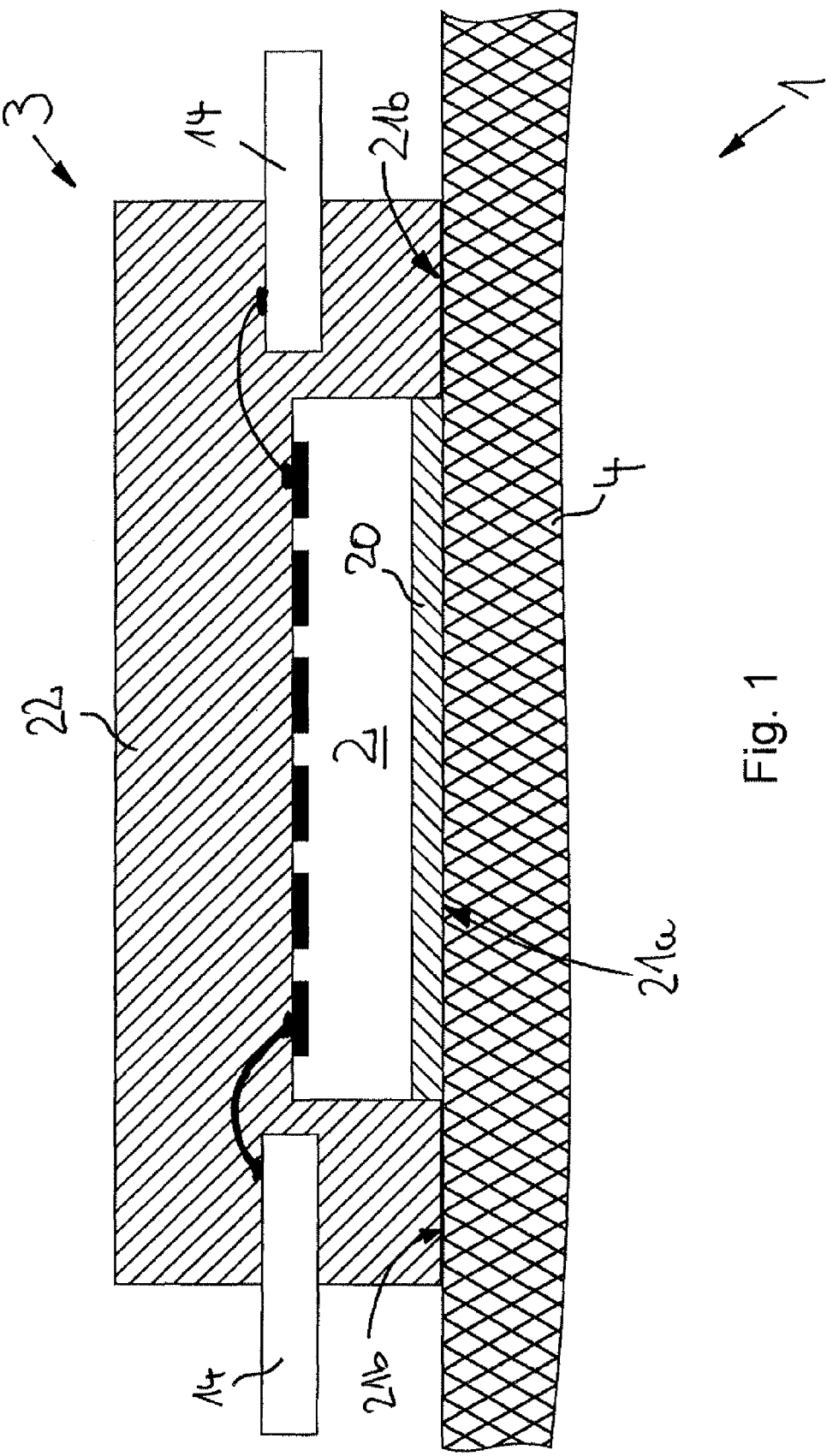

The invention relates to a triggering device for a safety device in an automotive vehicle, in particular for an airbag, having at least one electrical component that has a force sensor and that is attached to the body of the automotive vehicle in such a way that a measurement signal that is dependent on the deformation of the body can be applied at a measurement signal output of the force sensor, and having an evaluation device that is used to process the measurement signal and that is connected to the measurement signal output.

A triggering device of this type is known from DE 43 25 414 C2. As force sensors it has thin-film pressure sensors whose electrical resistance is inversely proportional to the applied force. The thin-film pressure sensors are connected to an evaluation device that generates a triggering signal for the safety device depending on the measurement signals. The thin-film sensors are located on a side door of the automotive vehicle between the outer skin of the vehicle body and an impact bar. A rigidity-increasing beam is located on the back side of the outer skin that faces away from the impact bar at a distance from said outer skin. When force is applied to the outer skin, at first only the outer skin is deformed. It is not until the rigidity-increasing beam begins to oppose the further deformation of the outer skin that the measurement signal increases significantly in such a way that the evaluation device activates the triggering signal. The triggering device necessitates relatively elaborate wiring on the automotive vehicle and therefore is relatively expensive.

This leads to the object of providing a triggering device of the type cited above that is economical to produce.

This object is accomplished when the force sensor has at least one piezo element that is integrated monolithically together with the evaluation device in a CMOS chip. A piezo element is understood, in particular, to mean a piezoresistive element. However, the piezo element may also be designed in such a way that it generates an electrical voltage when a force is applied. A CMOS chip is also understood to mean a bi-CMOS chip in which, in addition to at least one CMOS design element, at least one bipolar design element is integrated. Furthermore, a CMOS chip is also understood to mean a so-called BCDMOS, in which at least one DMOS transistor is integrated.

The at least one force sensor and the evaluation device may then be manufactured economically in high volume as a CMOS chip utilizing a standard CMOS process. In this case, the electrical connection lines between the force sensor and the evaluation device may also be integrated into the CMOS chip. The evaluation device preferably comprises at least one filter for the measurement signal from the piezo element. The filtered measurement signal, which preferably has a lower data volume than the unfiltered measurement signal, can then be transferred to a further semiconductor chip, so that there it can generate a triggering signal for the safety device depending on the filtered measurement signal and, if present the filtered measurement signal from at least one additional CMOS chip having a piezo element and an evaluation device.

In a preferred embodiment of the invention the CMOS chip has a plurality of piezo elements that preferably are connected to each other at a bridge circuit, more preferably a Wheatstone bridge. By this means, changes in the measurement signal due to temperature fluctuations and/or tolerances in the piezo elements can largely be prevented. In some cases it is even possible to integrate a compensation circuit having a temperature sensor in order to compensate for any remaining dependency of the measurement signal on the temperature in the CMOS chip. The bridge circuit may also be emulated by means of software, in which case the measurement signals from a plurality of piezo elements must be acquired separately from each other and processed with each other with the aid of a microcomputer.

In a preferred embodiment of the invention, the evaluation device has a nonvolatile data memory in which at least one triggering characteristic value is stored, and the evaluation device has a comparison device to compare the at least one triggering characteristic value with the measurement signal, and the evaluation device is designed in such a way that a triggering signal can be generated depending on the result of this comparison. An $E^2$-PROM preferably is provided as the data memory. The CMOS chip may then be adapted in a simple manner to various automotive vehicles and/or different installation situations in an automotive vehicle by programming one or more appropriate characteristic values that adapt the CMOS chip to the given desired triggering characteristic into the data memory. In this way, the same CMOS chip can be used for different applications.

It is advantageous if the CMOS chip has a plurality of piezo elements that are connected to the evaluation device and with which force measurement signals may be measured for at least two principal measurement directions that are arranged perpendicular to each other, and if the evaluation device is designed in such a way that the triggering signal is generated depending on the amount, the rate of change and/or the direction of a measurement signal resulting from the measurement signals that are produced. This makes it possible to activate the triggering signal only upon the occurrence of particular deformations of the vehicle body, for example upon a side impact and/or a frontal impact.

It is useful if the triggering device has at least two piezo elements that are arranged at an angle of about 45° relative to each other and if at least one of these piezo elements is arranged so that its principal measurement direction preferably is parallel to the alignment of the crystals in the CMOS chip and/or to a peripheral area and/or an edge of the CMOS chip. With the piezo element that has its measurement orientation arranged in the one direction, primarily the surface voltage of the CMOS chip is measured, while with the piezo element that has its measurement direction orientation arranged in the other direction, primarily the shear voltage in CMOS chip or the torque that acts upon the CMOS chip is measured. Depending on the measurement signals for the surface voltage and the shear voltage, conclusions may be drawn regarding the nature of the deformation of the vehicle body. In this way it is possible to only trigger the safety device when certain deformation patterns are present. The piezo elements preferably are arranged in such a way that the shear stress and the surface stress can be measured along three axes that preferably are orthogonal with respect to reach other (a, b, c or x, y, z, respectively).

In a preferred embodiment of the invention the CMOS chip is connected in a manner that is essentially two-dimensional and via an interference fit to a first surface region of the vehicle body by means of an adhesive layer that extends roughly parallel to the principal plane of extension of the CMOS chip, and the arrangement that is comprised of the CMOS chip and the at least one adhesive layer is covered with a solidified casting compound that is connected to a second surface region of the automotive body that laterally borders on the adhesive layer in a tightly sealing manner. When the automotive body is manufactured, the CMOS chip may be adhesively bonded to the automotive body and molded together with the casting compound in such a way that the CMOS chip is encapsulated by the casting compound and the vehicle body. When the body is deformed, the deformation forces acting upon the body are transferred by means of the adhesive layer directly onto the CMOS chip and, therefore, onto the at least one force sensor. The casting compound preferably comprises a flexible material whose ability to yield is selected in such a way that, upon a deformation of the body, the forces are primarily transferred from the body through the adhesive layer to the CMOS chip.

It is useful if the CMOS chip is connected by means of the least two stacked adhesive layers to the first surface region of the automotive body, in which case a metal foil is disposed between these adhesive layers. In this case the metal foil makes it possible to have a connection between the CMOS chip and the body that offers good thermal conductivity, so that the heat from energy losses in the CMOS chip can be dissipated via the body across a large surface area into the environment.

In a preferred embodiment of the invention the CMOS chip is molded together a casting compound that surrounds it in a tightly sealing manner, and the casting compound has at least two holes that are separated laterally from each other and through which fasteners are passed, by which means the electronic component that is comprised of the CMOS chip and the casting compound is connected to the body via an interference fit. In this case, screws are preferably provided as the fasteners. In the event that service must be performed on the vehicle, the triggering device may then be easily removed from the body and replaced by a corresponding replacement part. The CMOS chip is preferably located between the holes in such a manner that the deformation forces that act upon the body can be transferred effectively to the CMOS chip by means of the fasteners and the preferably rigid casting compound.

In another preferred embodiment of the invention the CMOS chip is connected via an interference fit to the body of the vehicle by means of a casting compound that adheres to the body (4), and the casting compound preferably is located between the CMOS chip and the body and/or grasps the body from behind. In this case it is even possible that the casting compound passes through at least one hole provided in the wall of the body and grasps from behind a peripheral area of this hole on the side of the body wall facing away from the CMOS chip.

In another embodiment of the invention, the component is covered by a preferably plate-shaped retention part, and the retention part is clamped to the body at fastening points on both sides of the electronic component and is supported against the body between the fastening points across the electronic component. The component that is produced from the casting compound or the encapsulation and the CMOS chip is then pressed by the retention part onto the body, preferably in an essentially two-dimensional manner, and, when the body deforms, it also deforms together with the body.

It is advantageous if the component is attached to a part of the outer skin of the body that forms the body wall, in particular at its back side facing away from exterior side of the vehicle. The deformation forces acting upon the outer skin of the body may then be measured directly by the at least one piezo element at the onset of the deformation.

In a preferred embodiment of the invention, a bus interface, which preferably is compatible with the PSI5 standard, is integrated into the CMOS chip.

In a preferred embodiment of the invention the triggering device has a diagnostic device that has means to detect a signal component that is contained in the measurement signal and that is caused by vibrations caused by an engine that powers the automotive vehicle, in particular by an internal combustion engine. With the aid of the diagnostic device it is then possible to check whether the force sensor is functioning properly and is connected to the vehicle via an interference fit. If the force sensor were to come loose from the body, the engine vibrations would no longer be transferred to the force sensor, or would only be transferred to a small extent. This defect could be detected with the aid of the diagnostic device and could possibly be displayed. The diagnostic device may also have means for checking the electrical operating voltage of the CMOS chip and/or the proper operation of the bus interface. If a defect is detected, the safety device may be switched to an emergency mode program.

It is advantageous if at least one additional sensor that differs from the force sensor, in particular a temperature sensor, a sensor for measuring an electrical capacitance, a magnetic field sensor, and/or a moisture sensor, is integrated into the CMOS chip. The additional sensors may be assigned to the diagnostic device for diagnostic purposes, and/or they may be connected to the evaluation device in order to compensate the measurement signal in response to interfering factors. It is also possible to perform a plausibility test on the measurement signal from the force sensor. With the aid of the capacitative sensor, the distance from the CMOS chip to the body and therefore the existence of an interference fit to the body may be checked.

In a preferred embodiment of the invention, the at least one additional sensor comprises a pressure sensor and/or an acceleration sensor, and an output of the pressure sensor and/or the acceleration sensor is connected to an input of the evaluation device. The pressure sensor may, in particular, be an air pressure sensor designed to measure air pressure and/or an air pressure change. The pressure sensor may be located in an interior cavity of the vehicle, for example in the interior of a vehicle door, of a rear hatch, or of a front hood. By evaluating the different measurement signals and/or comparing the measurement signal from the pressure sensor and/or acceleration sensor with that of the force sensor, it is also possible to obtain information on the nature of an impact causing the deformation of the body. In this way the evaluation device can determine, based on the various measurement signals, whether, for example, a large and heavy object such as another vehicle or a small and light object, such as a ball, has caused the deformation of the vehicle body. The evaluation device may then be designed in such a way that it activates a safety device depending on the nature of the impact. In some cases it is even possible for the evaluation device to have a control connection to a plurality of safety devices and, depending on the nature of the impact, to trigger a single safety device, a group of at least two safety devices, and/or all of the safety devices.

Figure 2:
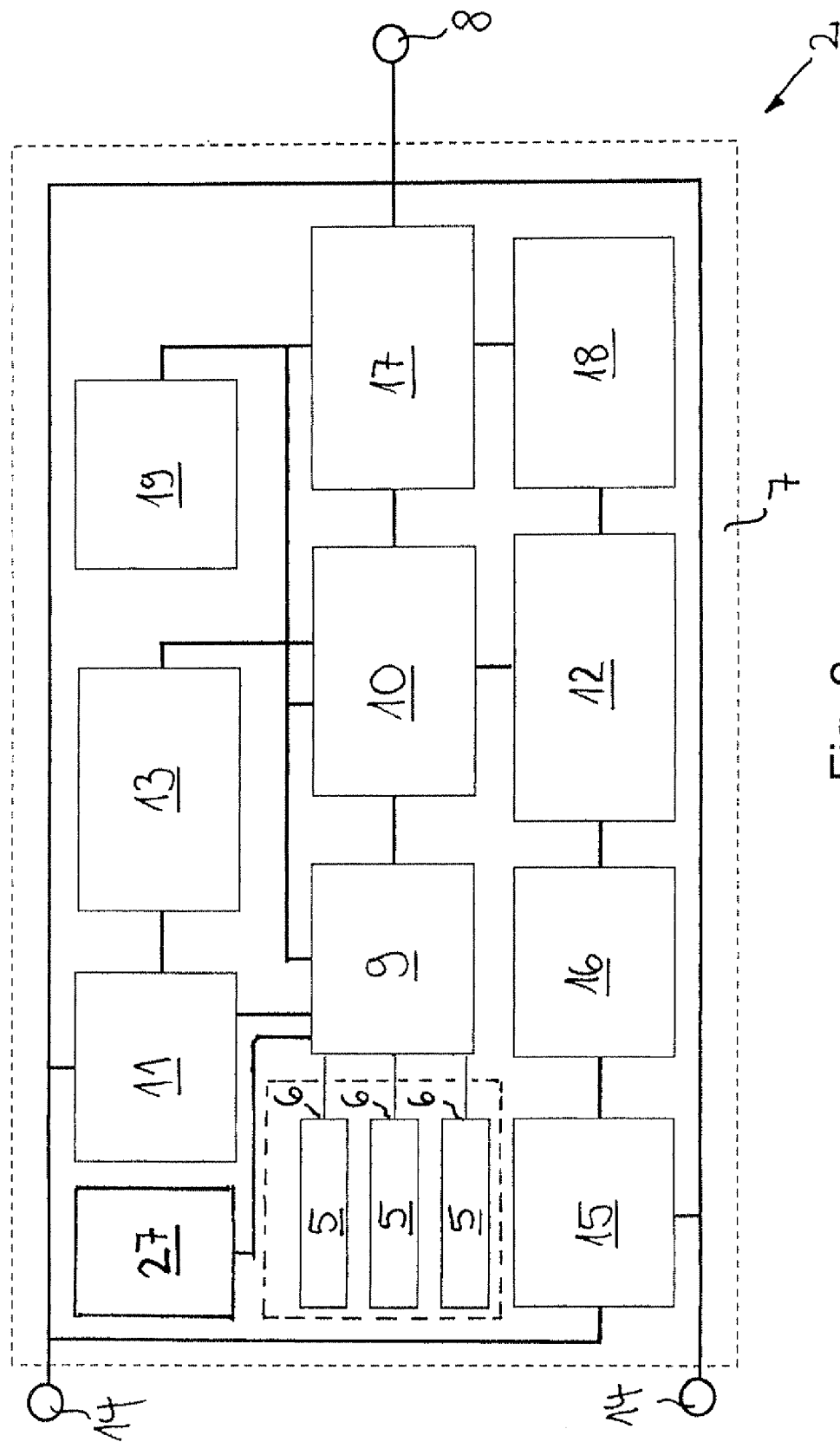
Figure 3:
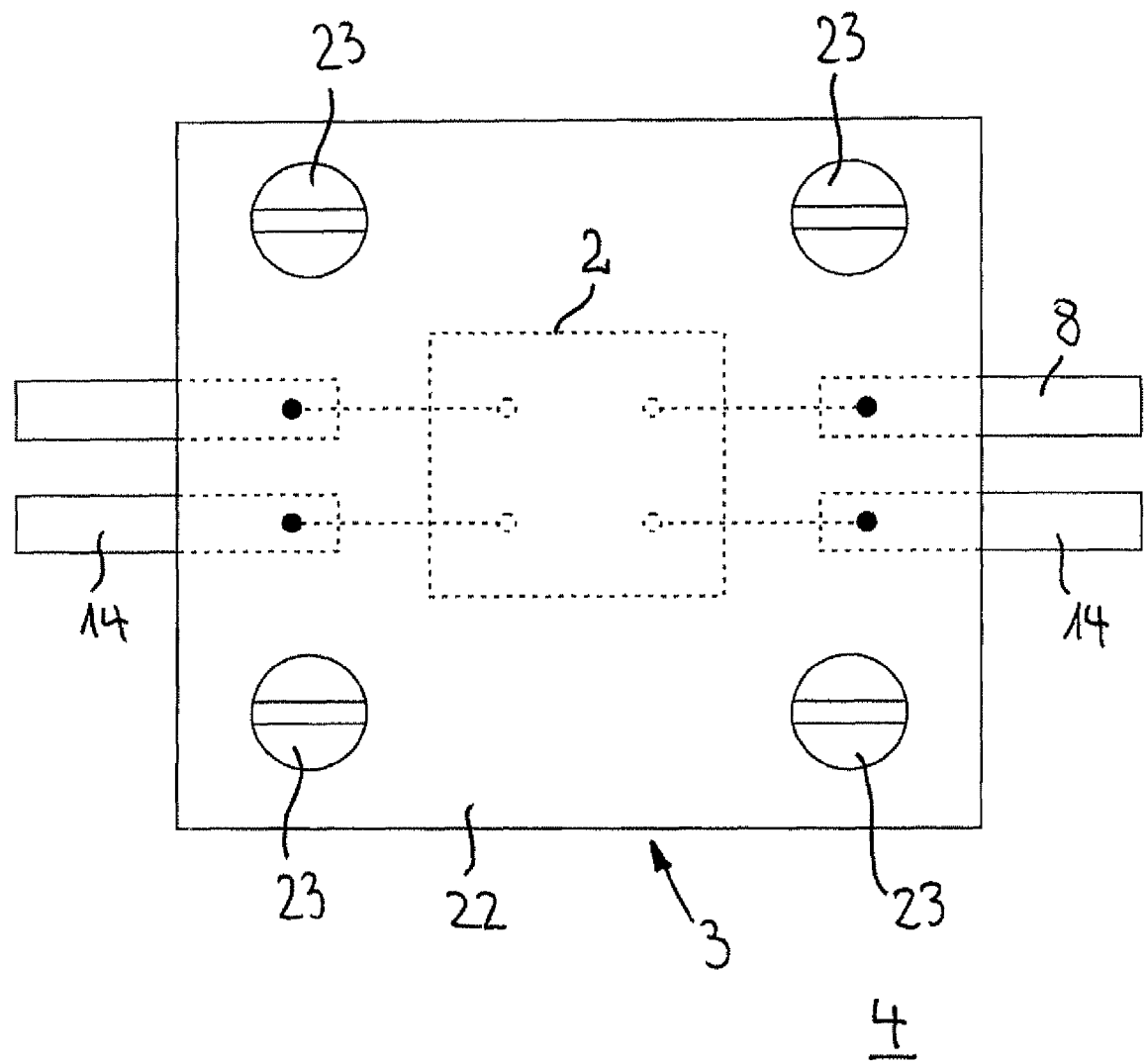
Figure 4:
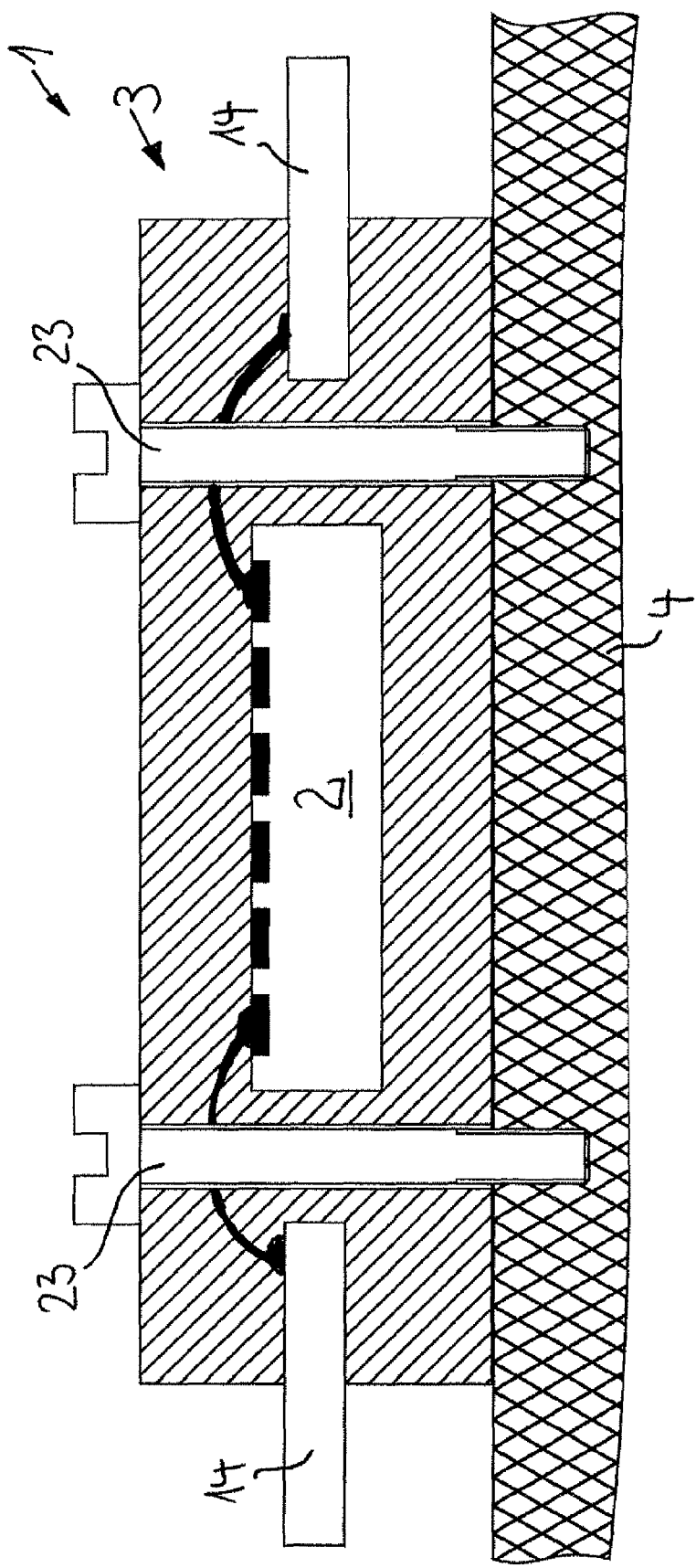
Figure 5:
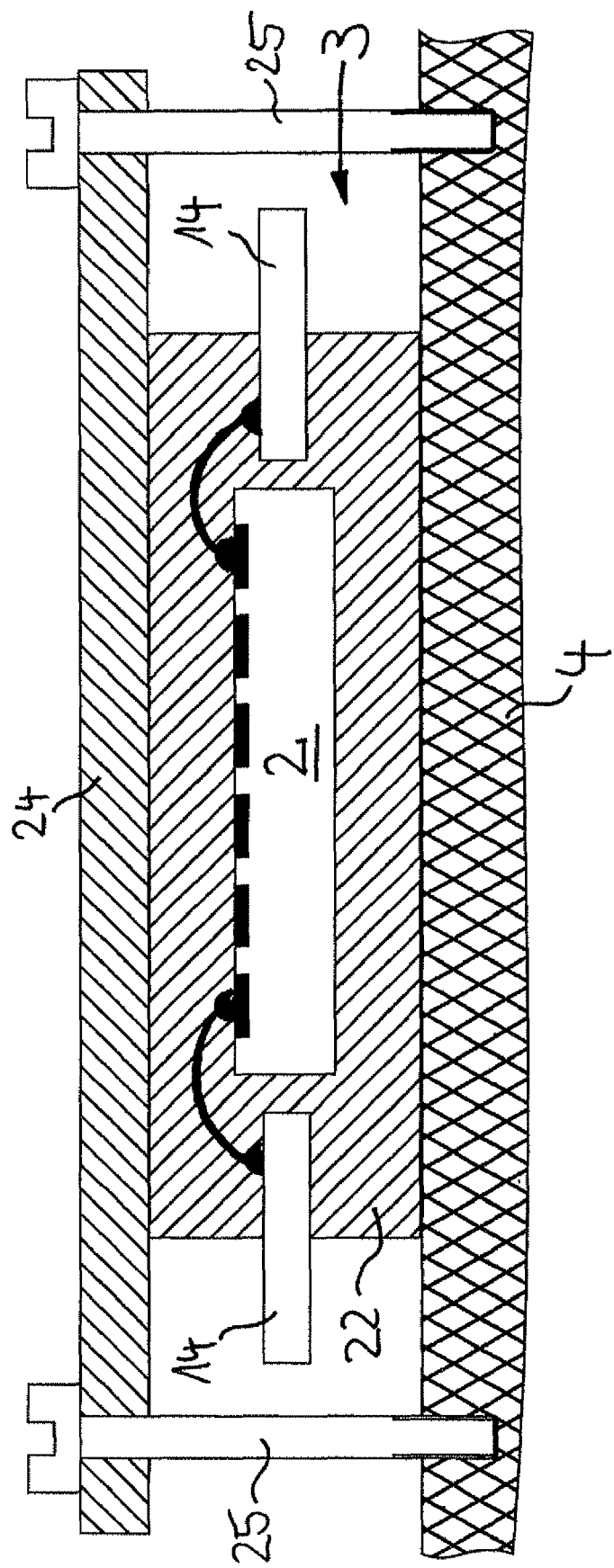
Figure 6:
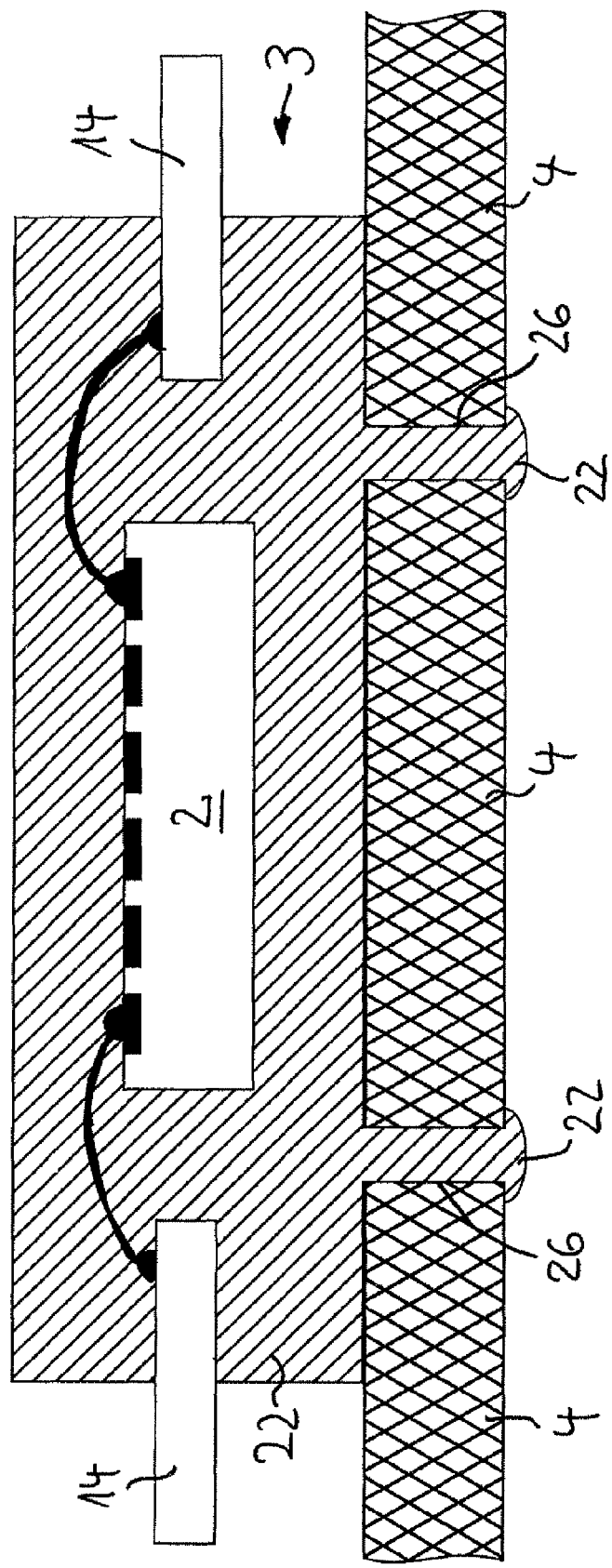
Figure 7:
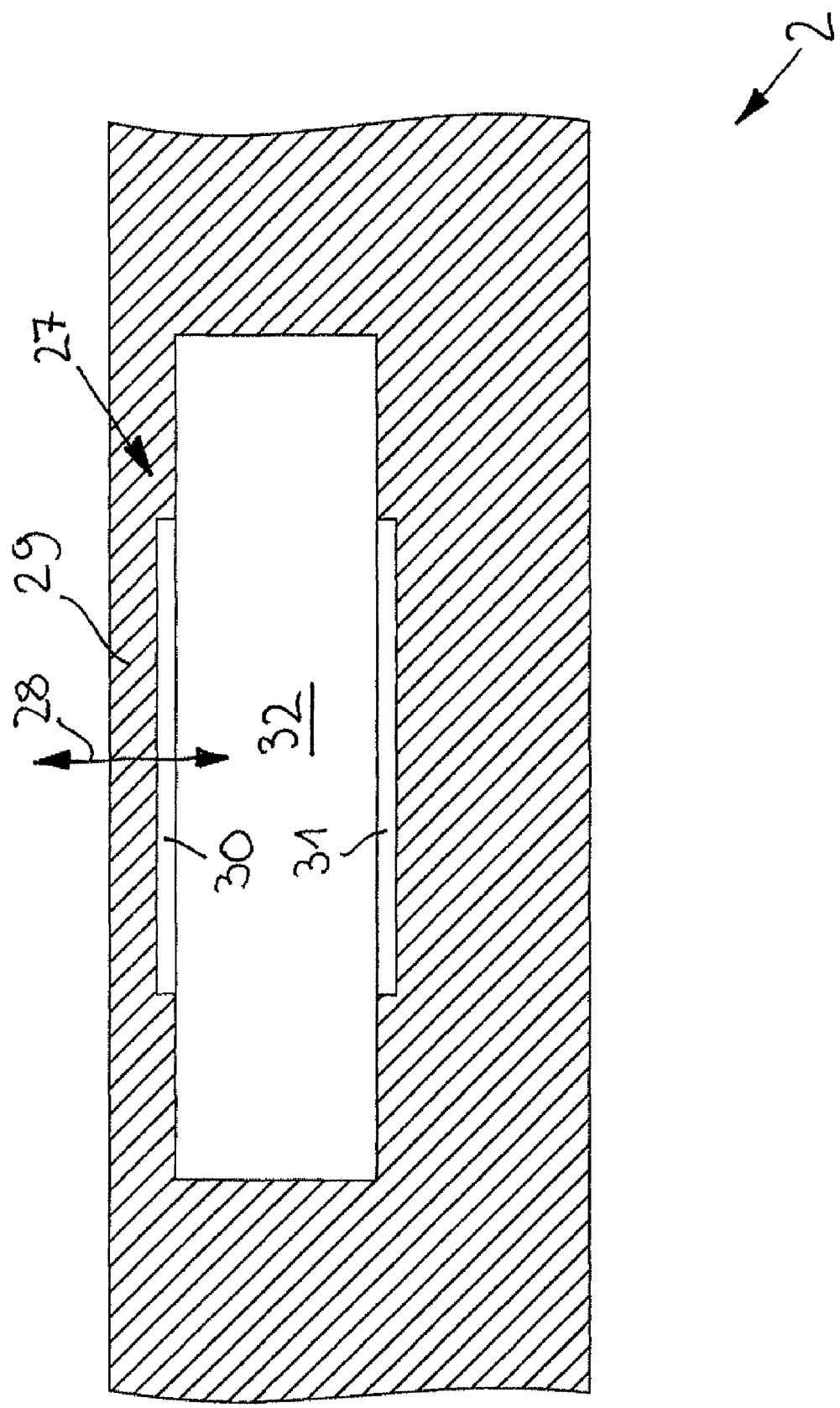
Figure 8:
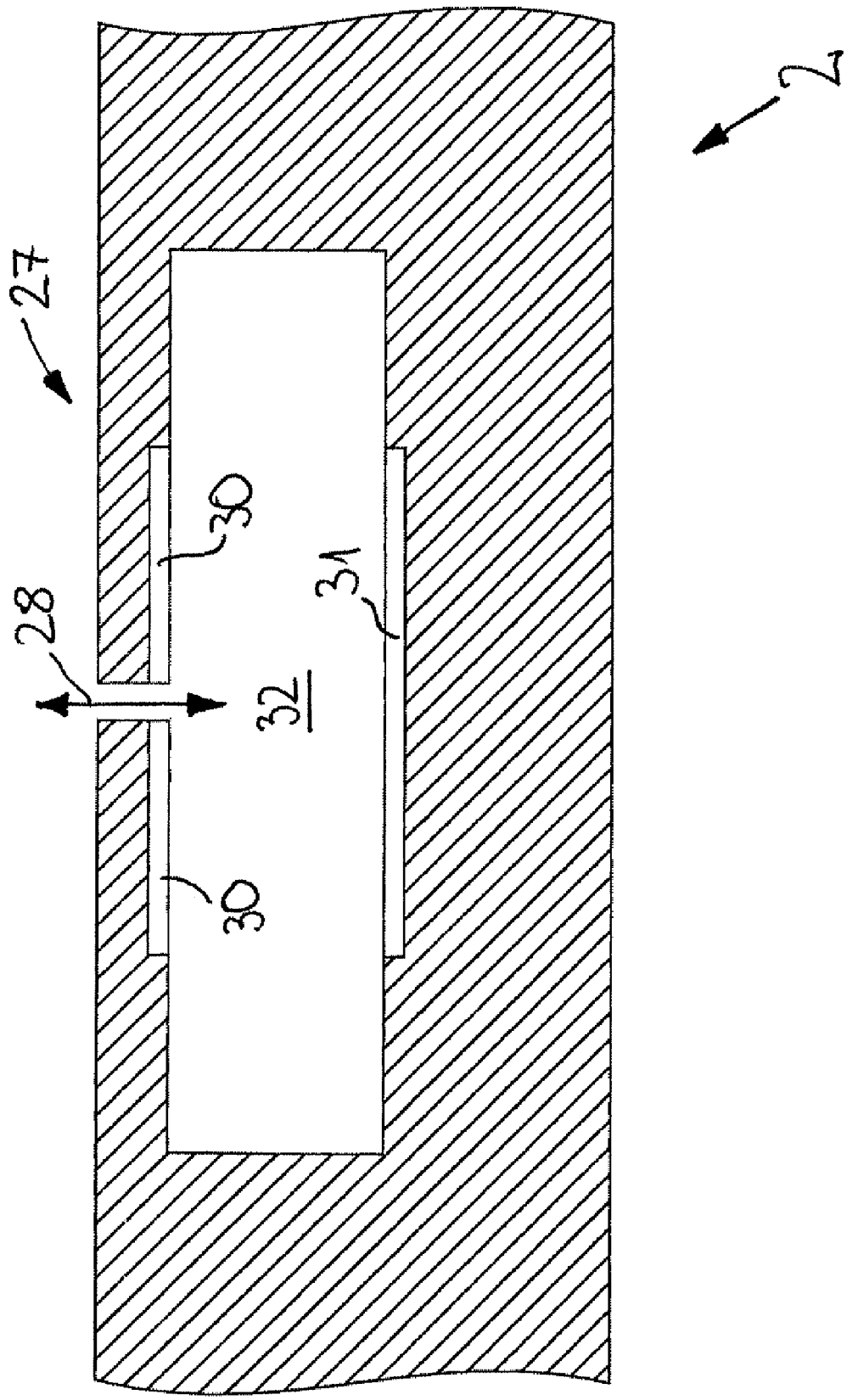

The text below explains embodiment examples of the invention in greater detail based on the drawing. The drawing shows:

FIG. 1 a cross section through a CMOS chip that is adhesively bonded in an essentially two-dimensional manner to an automotive body, in which piezoresistive force sensors and an evaluation device are monolithically integrated, FIG. 2 a schematic diagram of a CMOS chip in which a circuit for triggering an airbag in an automotive vehicle is integrated, FIG. 3 a plan view of an electric component that contains a CMOS chip and that is attached to an automotive body at a plurality of locations by means of a treaded fastener, FIG. 4 a cross section through the arrangement shown in FIG. 3, FIG. 5 a side view of an electric component that contains a CMOS chip and that is clamped between a plate-shaped retention part and an automotive body, FIG. 6 a cross section through a CMOS chip that is encapsulated by a casting compound that grasps the automotive body from behind to produce an interlocking fit, FIG. 7 a cross section through a first pressure sensor, and FIG. 8 a cross section through a second pressure sensor.

A triggering device identified in its entirely in FIG. 1 by reference number 1 for an airbag in an automotive vehicle has an electronic component 3 that has a CMOS chip 2 and that is fastened to the body 4 of the automotive vehicle is such a way that upon a deformation of the body 4 forces are transferred from the body 4 to the CMOS chip 2.

A plurality of force sensors 5, whose primary measurement directions are perpendicular to each other, are integrated into the CMOS chip 2 by means of a standard CMOS process. Each of these force sensors 5 has a measurement signal output 6 that is connected to an evaluation device 7, which is also integrated into the CMOS chip 2. Measurement signals for various components of a force that acts on the CMOS chip 2 are present at the measurement signal outputs 6. For example, these components may be the x, y, and z components of the force in a Cartesian coordinate system.

The force sensors 5 each have a Wheatstone bridge whose bridge resistances are formed by piezo elements. When a force is applied to the CMOS chip 2, an electrical voltage that is dependent on the force is present at each of the measurement signal outputs 6.

The evaluation device 7 has an output connection 8 at which a triggering signal for the airbag can be applied depending on the measurement signals from the force sensors 5. In FIG. 2 it can be seen that the measurement signal outputs 6 are each connected via an analog/digital converter 9 to an input of a signal processor 10. The analog/digital converter 9 is connected to a reference voltage source 11 that is integrated into the CMOS chip 2.

A nonvolatile data memory 12, such as an EEPROM, in which at least one triggering characteristic value is stored, is connected to the signal processor 10.

The triggering characteristic value may, for example, comprise a limit value for the rate of increase of the measurement signals. With the aid of the signal processor 10, the measurement signals and/or measurement values derived from them may be compared with the at least one triggering characteristic value.

A temperature sensor 13, which is connected to the signal processor 10 in order to compensate for changes in the measurement signals that occur upon temperature fluctuations, is also integrated into the CMOS chip 2.

The CMOS chip 2 has voltage supply connections 14 that are connected to an onboard voltage source in the vehicle, which is not shown in the drawing, for example to an automotive battery. A monitoring device 15 for the supply voltage that is connected to the voltage supply connections 14 and a locking device 16 is integrated into the CMOS chip 2. With the aid of the locking device, the reading of data from the data memory 12 is disabled if the electrical operating voltage that is present at the voltage supply connections 14 is too low.

A bus interface 17, which is compatible with the PSI5 standard, is integrated into the CMOS chip 2. In order to output the triggering signal to the output connection 8, the bus interface 17 is connected to the signal processor 10 and the output connection 8. A diagnostic device 18, which is integrated into the CMOS chip 2, is also connected to the bus interface 17. The operating state of the components 3 and, in particular, the occurrence of faults, may be monitored with the aid of the diagnostic device 18. If needed and/or if requested, a corresponding status signal can be sent on the bus.

It must also be noted that an oscillator 19 is integrated into the CMOS chip 2 in order to generate a clock signal. The oscillator 19 is connected to the clock signal inputs of the analog/digital converter 9, the signal processor 10, and the bus interface 17.

In the case of the embodiment example shown in FIG. 1, the CMOS chip is connected in an essentially two-dimensional manner via an interference fit to a first surface region 21a of the vehicle body 4 by means of an adhesive layer 20 that runs roughly parallel to the principal plane of extension of said chip. The arrangement comprising the CMOS chip 2 and the adhesive layer 20 is covered by a solidified casting compound 22 that adheres to a second surface region 21b, which is present on the vehicle body 4 and which laterally surrounds adhesive layer 20, and that forms a seal with respect to the surface region.

In the embodiment example of FIGS. 3 and 4, the CMOS chip 2 is molded together with a casting compound 22 that forms a housing. The casting compound 22 has a plurality of holes that are laterally spaced apart from each other and through which in each case a fastener 23, namely a screw, is passed. At one end of the fastener 23 there is a threaded section that is screwed into the body 4 and whose other end extends beyond the margin of the casting compound 22 that surrounds the hole. In this way the component 3 is pressed against the body 4. In FIG. 3 it can be seen that the CMOS chip 2 is located between the fasteners 23.

In the embodiment example shown in FIG. 5, the component 3 is covered by a plate-shaped retention part 24, which is clamped on both sides of the electronic component 3 to the body 4 with the aid of screws 25. The retention part 24 is supported against the body 4 by the electronic component 3 between the screws 25. In this way the component 3 abuts against the body 4 in an essentially two-dimensional manner.

As can be seen in FIG. 6, the CMOS chip 2 may also be encapsulated with a casting compound 22 that adheres via an interference fit to the body 4 and passes through holes 26 in the body 4. In this way, the casting compound 22 grasps behind the peripheral area of the holes 26 to produce an interlocking fit on the side of the body 4 facing away from the CMOS chip 2.

In FIG. 7 it can be seen that a pressure sensor 27 is integrated into the CMOS chip 2 in addition to the force sensor 5. The pressure sensor 27 has a diaphragm 29 that can be displaced in the direction of the double arrow 28 by air pressure changes and that is adjacent to a cavity 32 that is disposed in the semiconductor substrate of the CMOS chip 2. The pressure sensor 27 is designed as a capacitive pressure sensor 27 that has at the diaphragm a first electrode 30 and at a fixed wall area of the cavity 32 opposite the diaphragm has a second electrode 31. If the diaphragm 29 is deflected in the direction of the double arrow 28, the distance between electrodes 30 and 31 changes, which thereby changes the electrical capacitance of the capacitor formed by electrodes 30, 31. Depending on the changing capacitance, an electrical signal, such as a voltage or a current, is generated and is communicated to the evaluation device 7. In FIG. 9 it can be seen that an output of the pressure sensor 27 is connected for this purpose to an input of the analog/digital converter.

In the evaluation device 7 the measurement signal from the force sensor is compared with the output signal from the pressure sensor 27. If a deformation occurs on the body 4, the magnitude of the measurement signal from the force sensor will then increase and exceed the triggering characteristic value assigned to it.

Shortly after the increase of the force sensor measurement signal, the pressure sensor 27 will record a pressure increase. If the pressure increase is less than a predetermined triggering characteristic value assigned to the pressure sensor, it is assumed that only a small deformation of the body 4 is present, for which it is not necessary to trigger the safety device. A low pressure increase of this type may occur, for example, when a ball strikes to the outer skin of the body.

On the other hand, if the force sensor measurement signal as well as the pressure increase each exceed the respective triggering characteristic value, it is assumed that a serious deformation is present. In this case the safety device 20 is activated.

FIG. 8 shows that electrode 30, which may be deflected in the direction of the double arrow, may also be located on a flexing beam that is connected as a single part to the semiconductor substrate of the CMOS chip 2.

The invention claimed is:

1. A triggering device for a safety device in an automotive vehicle, the triggering device comprising:
   an electrical component that has at least one force sensor and that is attached to the body of the automotive vehicle in such a way that a measurement signal that is dependent on the deformation of the body is applied at a measurement signal output of the force sensor; and
   an evaluation device that is used to process the measurement signal and that is connected to the measurement signal output,
   wherein the force sensor has at least one piezo element that, together with the evaluation device, is monolithically integrated into a CMOS chip,
   wherein the evaluation device has a nonvolatile data memory in which at least one triggering characteristic value is stored, the evaluation device has a comparison device to compare the at least one triggering characteristic value with the measurement signal, and wherein the evaluation device is configured such that the triggering signal is generated depending on the result of this comparison.

2. The triggering device of claim 1, wherein the CMOS chip has a plurality of piezo elements that are connected to each other at a Wheatstone bridge circuit.

3. The triggering device of claim 1, wherein the CMOS chip has a plurality of piezo elements that are connected to the evaluation device Hand with which force measurement signals may be measured for at least two principal measurement directions that are arranged perpendicular to each other, and wherein the evaluation device is designed in such a way that the triggering signal is generated depending on the magnitude, the rate of change and/or the direction of a measurement signal resulting from the measurement signals that are produced.

4. The triggering device of claim 1, wherein it has at least two piezo elements that are arranged at an angle of about 45° relative to reach other and at least one of these piezo elements is arranged so that its principal measurement direction is parallel to the orientation of the crystals in the CMOS chip and/or to a peripheral area and/or an edge of the CMOS chip.

5. The triggering device of claim 1, wherein the CMOS chip is connected in an essentially two-dimensional manner via an interference fit to a first surface region of the vehicle body by means of an adhesive layer that extends roughly parallel to the principal plane of extension of the chip, and the arrangement that is comprised of the CMOS chip and the at least one adhesive layer is covered with a solidified casting compound that is connected in a tightly sealing manner to a second surface region of the automotive body that laterally borders on the adhesive layer.

6. The triggering device of claim 1, wherein the CMOS chip is connected by means of the least two stacked adhesive layers to the first surface region of the automotive body, and a metal foil is located between these adhesive layers.

7. The triggering device of claim 1, wherein the CMOS chip is covered by a casting compound that surrounds it in a tightly sealing manner, and the casting compound has at least two holes that are separated laterally from each other and through which the fasteners are passed, by which means the electronic component that is comprised of the CMOS chip and the casting compound is connected to the body via an interference fit.

8. The triggering device of claim 1, wherein the CMOS chip is connected with via an interference fit to the body of the vehicle by means of a casting compound that adheres to the body, and the casting compound is located between the CMOS chip and the body and/or grasps the body from behind.

9. The triggering device of claim 1, wherein the component is covered by a plate-shaped retention part, and the retention part is clamped to the body at fastening points on both sides of the electronic component and is supported against the body between the fastening points across the electronic component.

10. The triggering device of claim 1, wherein the component is attached to a part of the outer skin of the body that forms the body wall at its back side facing away from exterior side of the vehicle.

11. The triggering device of claim 1, wherein a bus interface, which preferably is compatible with the PSI5-Standard, is integrated into the CMOS chip.

12. The triggering device of claim 1, wherein the triggering device has a diagnostic device that has means to detect a signal component that is contained in the measurement signal and that is caused by vibrations caused by an internal combustion engine powering the automotive vehicle.

13. The triggering device of claim 1, wherein at least one additional sensor that differs from the force sensor, in particular a temperature sensor, a sensor for measuring an electrical capacitance, a magnetic field sensor, and/or a moisture sensor, is integrated into the CMOS chip.

14. The triggering device of claim 1, wherein the at least one additional sensor comprises a pressure sensor and/or an acceleration sensor, and in that an output of the pressure sensor and/or the acceleration sensor is connected to an input of the evaluation devices.

15. The triggering device of claim 1, wherein a pressure sensor is integrated into the CMOS chip.

16. The triggering device of claim 1, wherein the evaluation device compares the measurement signal from the force sensor with an output signal of the pressure sensor.

* * * * *